United States Patent
Gabelnick et al.

(10) Patent No.: US 6,815,014 B2
(45) Date of Patent: Nov. 9, 2004

(54) CORONA-GENERATED CHEMICAL VAPOR DEPOSITION ON A SUBSTRATE

(75) Inventors: Aaron M. Gabelnick, Midland, MI (US); Richard T. Fox, Midland, MI (US); Ing-Feng Hu, Midland, MI (US); Dmitry P. Dinega, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 10/357,019

(22) Filed: Feb. 3, 2003

(65) Prior Publication Data

US 2004/0091637 A1 May 13, 2004

Related U.S. Application Data

(60) Provisional application No. 60/354,905, filed on Feb. 5, 2002, and provisional application No. 60/408,640, filed on Sep. 6, 2002.

(51) Int. Cl.[7] .................................................. C08F 2/46
(52) U.S. Cl. .................. 427/488; 427/162; 427/255.29; 427/255.393; 427/255.394; 427/489; 427/535; 427/569; 427/578
(58) Field of Search ................................. 427/489, 162, 427/488, 535, 569, 578, 255.29, 255.393, 255.394

(56) References Cited

U.S. PATENT DOCUMENTS

| | | | |
|---|---|---|---|
| 4,871,580 A | 10/1989 | Schram et al. ............. 427/38 |
| 4,929,319 A | * 5/1990 | Dinter et al. ............. 204/164 |
| 4,957,062 A | 9/1990 | Schuurmans et al. ....... 118/723 |
| 5,120,568 A | 6/1992 | Schuurmans et al. ......... 427/37 |
| 5,176,938 A | 1/1993 | Wallsten ................... 427/447 |
| 5,194,291 A | 3/1993 | D'Aoust et al. ........... 148/276 |
| 5,424,103 A | 6/1995 | Ahn ......................... 427/569 |
| 5,456,972 A | 10/1995 | Roth et al. ................. 428/224 |
| 5,576,076 A | 11/1996 | Slootman et al. .......... 427/579 |
| 6,082,292 A | 7/2000 | Denes et al. .............. 118/718 |
| 6,083,355 A | 7/2000 | Spence ..................... 204/164 |
| 6,106,659 A | 8/2000 | Spence ..................... 156/345 |
| 6,118,218 A | 9/2000 | Yializis ................. 315/111.21 |

FOREIGN PATENT DOCUMENTS

| EP | 0 367 004 | 5/1990 | .......... C23C/16/40 |
|---|---|---|---|
| EP | 0 580 944 A1 | 3/1993 | .......... C23C/18/12 |
| WO | WO 00/70117 | 11/2000 | .......... C23C/16/00 |

* cited by examiner

Primary Examiner—Bernard Pianalto

(57) ABSTRACT

A process for creating plasma polymerized deposition on a substrate by a corona discharge is described. The corona discharge is created between an electrode and a counterelectrode supporting a substrate. A mixture of a balance gas and a working gas is flowed rapidly through the electrode, plasma polymerized by corona discharge, and deposited onto the substrate as an optically clear coating or to create surface modification. The process, which is preferably carried out at or near atmospheric pressure, can be designed to create an optically clear powder-free or virtually powder free deposit of polymerized plasma that provides a substrate with properties such as surface modification, chemical resistance, and barrier to gases.

19 Claims, 3 Drawing Sheets

CORONA-GENERATED CHEMICAL VAPOR DEPOSITION ON A SUBSTRATE

CROSS-REFERENCE STATEMENT

This application claims the benefit of U.S. Provisional Application No. 60/354,905, filed Feb. 5, 2002 and U.S. Provisional Application No. 60/408,640, filed Sep. 6, 2002.

BACKGROUND OF THE INVENTION

The present invention relates to coating or modifying a substrate using corona-generated chemical vapor deposition.

The use of widely available and inexpensive polymers such as polyolefins is often limited by the undesirably low surface energy of these polymers. Consequently, more expensive materials having higher surface energy are often used where surface wettability or adhesion or both, are required. In recent years, an alternative approach has been developed, namely surface modification of low surface energy polymers using corona or plasma discharge.

For example, U.S. Pat. No. 5,576,076 (Slootman et al.) teaches that the performance of polyolefin film can be improved by creating a deposit of silicon oxide on a traveling substrate by subjecting the substrate to a corona discharge at atmospheric pressure in the presence of a silane such as $SiH_4$, a carrier gas, and oxygen or a gas capable of producing oxygen. Although the method described by Slootman et al. does indeed render the surface of the polymer more wettable, it suffers from at least two drawbacks. First, the preferred working gas ($SiH_4$) is an extremely hazardous material that ignites spontaneously in air; second, the deposition of silicon oxide is in the form of a powder, the creation of which limits the scope of potential applications and which rapidly fouls up equipment resulting in substantial down time.

Glow discharge plasma enhanced chemical vapor deposition (PECVD) has been used to produce coatings on substrates to improve their resistance to chemicals, wear, abrasion, scratching, and gas permeation. For example, in U.S. Pat. No. 6,106,659, Spence, et al. describes a cylinder-sleeve electrode assembly apparatus that generates plasma discharges in either an RF resonant excitation mode or a pulsed voltage excitation mode. The apparatus is operated in a rough-vacuum mode, with working gas pressures ranging from about 10 to about 760 Torr. Operation at rough-vacuum pressure is said to have advantages over operation at strictly atmospheric pressure because the required supply gas flow rate is significantly reduced compared to strictly atmospheric operation, allowing for the economical use of more expensive specialty gases. Furthermore, the generated coatings possess superior properties as compared to coatings formed using conventional corona-type discharge systems operating either at low or high pressures.

The method described by Spence, et al. suffers from the requirement of rough vacuum, which is a commercial disadvantage over strict atmospheric methods. Thus, it would be an advantage in the art of PECVD to be able to create contiguous (that is, non-powder-forming) coatings at atmospheric pressure.

SUMMARY OF THE INVENTION

The present invention addresses the deficiencies in the art by providing a process for preparing an optically clear deposit onto a substrate comprising the steps of 1) creating a corona discharge in a region between a) an electrode having at least one inlet and at least one outlet and b) a counterelectrode supporting a substrate; and 2) flowing a mixture of a balance gas and a working gas and, optionally, a carrier gas for the working gas through the electrode and the corona discharge at a sufficient flow rate and at such proportions to form the optically clear deposit onto the substrate.

In a second aspect, the present invention is a process for preparing a deposit onto a substrate comprising the steps of 1) creating a corona discharge in a region between a) an electrode having at least one inlet and at least one outlet and b) a counterelectrode supporting a substrate; and 2) flowing a mixture of a balance gas and a working gas and, optionally, a carrier gas for the working gas through the electrode and the corona discharge so as to form a plasma polymerized deposit on the substrate, wherein the total gas mixture has a flow rate such that the velocity through the at least one outlet is not less than 0.1 m/s and not greater than 1000 m/s and wherein the concentration of working gas based on the total gas mixture is not less than 5 ppm and not greater than 500 ppm.

In a third aspect, the present invention is a continuous process for preparing an optically clear coating onto a moving substrate comprising the steps of 1) creating a corona discharge in a region between a) an electrode having at least one inlet and at least one outlet and b) a counterelectrode supporting a moving substrate; and 2) flowing a mixture of a balance gas, a working gas and, optionally, a carrier gas for the working gas through the electrode and the corona discharge so as to form a plasma polymerizing coating on the substrate, wherein the balance gas has a flow rate such that the velocity through the at least one outlet is not less than 10 m/s and not greater than 200 m/s, wherein the concentration of the working gas based on the total gas mixture is not less than 5 ppm and not greater than 200 ppm, wherein the optically clear coating has an optical clarity of at least 98 percent and a haze value of not greater than 2 percent.

DETAILED DESCRIPTION OF THE INVENTION

Figure 1:
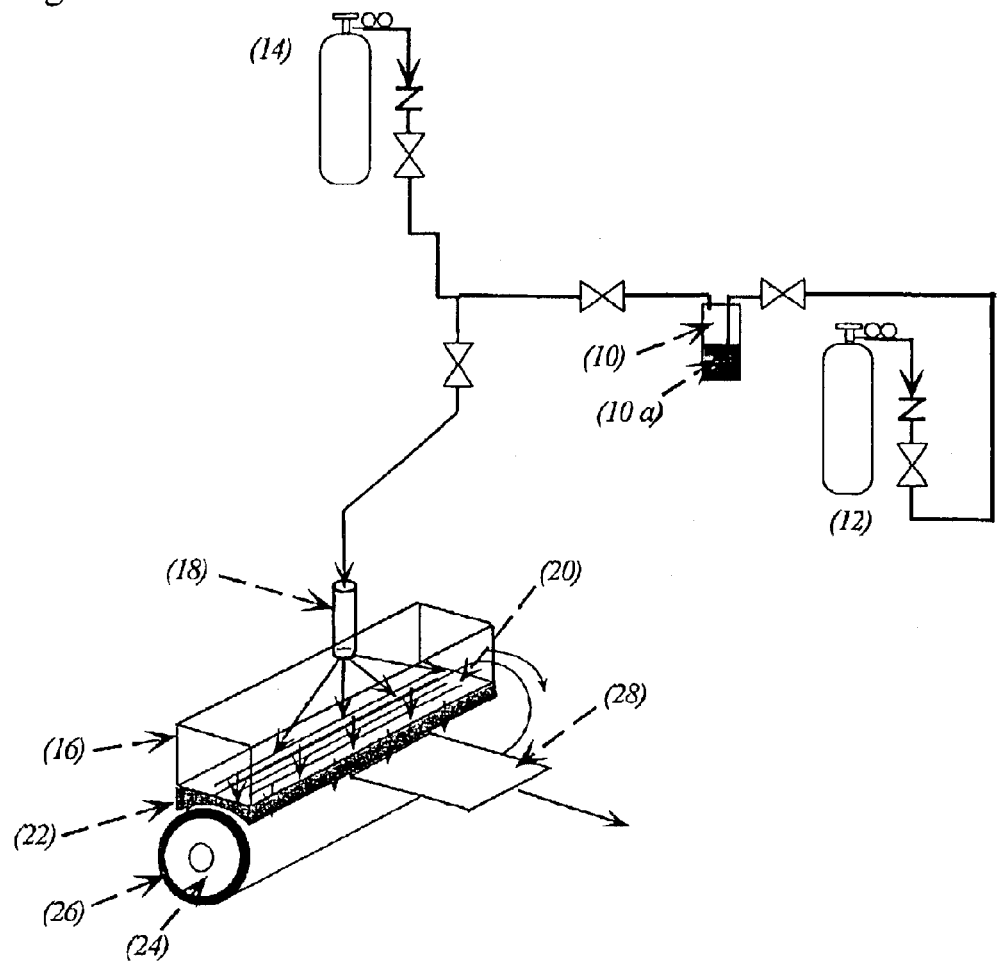
FIG. 1 is an illustration of a preferred apparatus used in the corona discharge process.

In the process of the present invention, sufficient power density and frequency are applied to an electrode to create and maintain a corona discharge in a spacing between the electrode and a counterelectrode, which is preferably a moving counterelectrode. The power density is preferably at least 1 W/cm$^2$, more preferably at least 5 W/cm$^2$, and most preferably at least 10 W/cm$^2$; and preferably not greater than 200 W/cm$^2$, more preferably not greater than 100 W/cm$^2$, and most preferably not greater than 50 W/cm$^2$. The frequency is preferably at least 2 kHz, more preferably at least 5 kHz, and most preferably at least 10 kHz; and preferably not greater than 100 kHz, more preferably not greater than 60 kHz, and most preferably not greater than 40 kHz.

The spacing between electrode and counterelectrode is sufficient to achieve and sustain a corona discharge, preferably at least 0.1 mm, more preferably at least 1 mm, and preferably not more than 50 mm, more preferably not more than 20 mm, and most preferably not more than 10 mm. The counterelectrode is preferably in the form of a rotating drum preferably fitted with a dielectric sleeve, and the substrate to be coated is preferably transported along the drum. For the purposes of this invention, the terms electrode and counterelectrode are conveniently used to refer to a first electrode and a second electrode, either of which can be powered with the other being grounded.

A mixture of gases including a balance gas and a working gas and optionally a carrier gas for the working gas (together, the total gas mixture) is flowed through the electrode, which contains at least one inlet and at least one outlet for passage of the gases, and the mixture is plasma polymerized by the corona discharge. The plasma polymerized mixture then forms an optically clear coating onto the moving substrate.

As used herein, the term "working gas" refers to a reactive substance, which may or may not be gaseous at standard temperature and pressure, that is capable of polymerizing to form a coating onto the substrate. Examples of suitable working gases include organosilicon compounds such as silanes, siloxanes, and silazanes. Examples of silanes include dimethoxydimethylsilane, methyltrimethoxysilane, tetramethoxysilane, methyltriethoxysilane, diethoxydimethylsilane, methyltriethoxysilane, triethoxyvinylsilane, tetraethoxysilane, dimethoxymethylphenylsilane, phenyltrimethoxysilane, 3-glycidoxypropyltrimethoxysilane, 3-methacrylpropyltrimethoxysilane, diethoxymethylphenylsilane, tris(2-methoxyethoxy) vinylsilane, phenyltriethoxysilane, and dimethoxydiphenylilane. Examples of siloxanes include tetramethyldisiloxane, hexamethyldisiloxane, octamethyltrisiloxane, and tetraethylorthosilicate. Examples of silazanes include hexamethylsilazanes and tetramethylsilazanes. Siloxanes are preferred working gases, with tetramethyldisiloxane being especially preferred.

As used herein, "carrier gas" refers to a gas, preferably an inert gas, that provides a convenient means to merge the balance gas with the working gas. Preferred carrier gases include nitrogen, helium, and argon.

As used herein, the term "balance gas" is a reactive or non-reactive gas that carries the working gas through the electrode and ultimately to the substrate. Examples of suitable balance gases include air, oxygen, $CO_2$, $O_3$, NO, nitrogen, helium, and argon, as well as combinations thereof. The flow rate of the total gas mixture is sufficiently high to drive the plasma polymerizing working gas to the substrate to form a contiguous film, as opposed to a powder. Preferably the flow rate of the total gas mixture is such that the velocity of the gas passing through the exit ports at least 0.1 m/s, more preferably at least 1 m/s, and most preferably at least 10 m/s; and preferably not greater than 1000 m/s, more preferably not greater than 500 m/s, and most preferably not greater than 200 m/s.

As defined herein "electrode" refers a single conductive element with an inlet and an outlet or a plurality of conductive elements spaced apart to create one or more gaps for gas to flow through. Thus, the term "through the electrode" refers to gas flowing through the inlet and outlet of the single element or through the gaps of the multiple elements.

In addition to the significance of control of absolute flow rates, control of the relative flow rates of the balance gas and the working gas, which determines the concentration of working gas in the total gas mixture, also contributes to the quality of the coating formed on the substrate. The concentration of the working gas in the total gas mixture entering the corona discharge is sufficient to create a deposit, preferably an optically clear coating, with a minimization of gas phase nucleation. Gas phase nucleation causes granule and powder formation in the coating, which results in diminished physical properties therein, as well as equipment fouling, which leads to costly downtime. The concentration of the working gas in the total gas mixture depends on the nature of the working gas and the balance gas as well as the type of coating or surface modification desired, but is preferably not less than 1 ppm, more preferably not less than 5 ppm, and most preferably not less than 10 ppm; and preferably not greater than 2000 ppm, more preferably not greater than 1000 ppm, and most preferably not greater than 500 ppm. Although it is possible to carry out the process of the present by applying a vacuum or partial vacuum in the corona discharge region, (that is, the region where the corona discharge is formed) the process is preferably carried out so that the corona discharge region is not subject to any vacuum or partial vacuum; that is, the process is preferably carried out at atmospheric pressure.

Plasma polymerization as carried out by the process of the present invention typically results in an optically clear coated substrate or a surface modified substrate. The term "optically clear" is used herein to describe a coating having an optical clarity of at least 70 percent, more preferably at least 90 percent, and most preferably at least 98 percent and a haze value of preferably not greater than 10 percent, more preferably not greater than 2 percent, and most preferably not greater than 1 percent. Optical clarity is the ratio of transmitted-unscattered light to the sum of transmitted-unscattered and transmitted-scattered light (<2.5°). Haze is the ratio of transmitted-scattered light (>2.5°) to total transmitted light. (See, for example, ASTM D 1003-97). The coating can be, for example, a surface modified coating such as an adhesion promoter or an antifog coating; an optical coating such as a reflective or antireflective coating; a chemical resistant coating; or a gas barrier coating for packaging.

The substrate used in the present invention is not limited. Examples of substrates include glass, metal, ceramic, paper, fabric, and plastics such as polyolefins including polyethylene and polypropylene, polystyrenes, polycarbonates, and polyesters including polyethylene terephthalate and polybutylene terephthalate.

FIG. 1 provides an illustration of a preferred apparatus used in carrying out a preferred method of the present invention. Referring now to FIG. 1, working gas (10) is generated from the headspace of a contained volatile liquid (10a) and carried by a carrier gas (12) from the headspace and merged with balance gas (14) to the electrode (16). The carrier gas (12) and the balance gas (14) drive the working gas (10) through the electrode (16), more particularly, through at least one inlet (18) of electrode (16), and through outlets (20), which are typically in the form of slits or holes or the gaps between a plurality of conductive elements. Power is applied to the electrode (16) to create a corona discharge (22) between the electrode (16) and the counterelectrode (24), which is a cylindrical roller preferably fitted a dielectric sleeve. It is to be understood that the electrode (16) may also or alternatively be fitted with a dielectric sleeve (not shown in the figure). Substrate (28) is passed continuously along the dielectric sleeve (26) and coated with plasma polymerizing working gas, which is preferably a polymerized siloxane.

Figure 2:
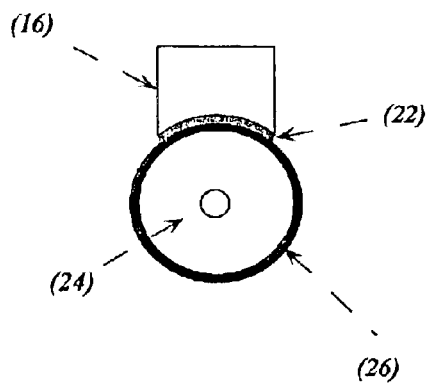
FIG. 2 is an illustration of the side view of the electrode and counterelectrode.

FIG. 2 is a side view illustration of electrode (16), counterelectrode (24), and corona discharge region (22). Where the substrate is conductive, the dielectric layer (26) is positioned over the non-moving electrode (16), not the moving counterelectrode (24).

Figure 3:
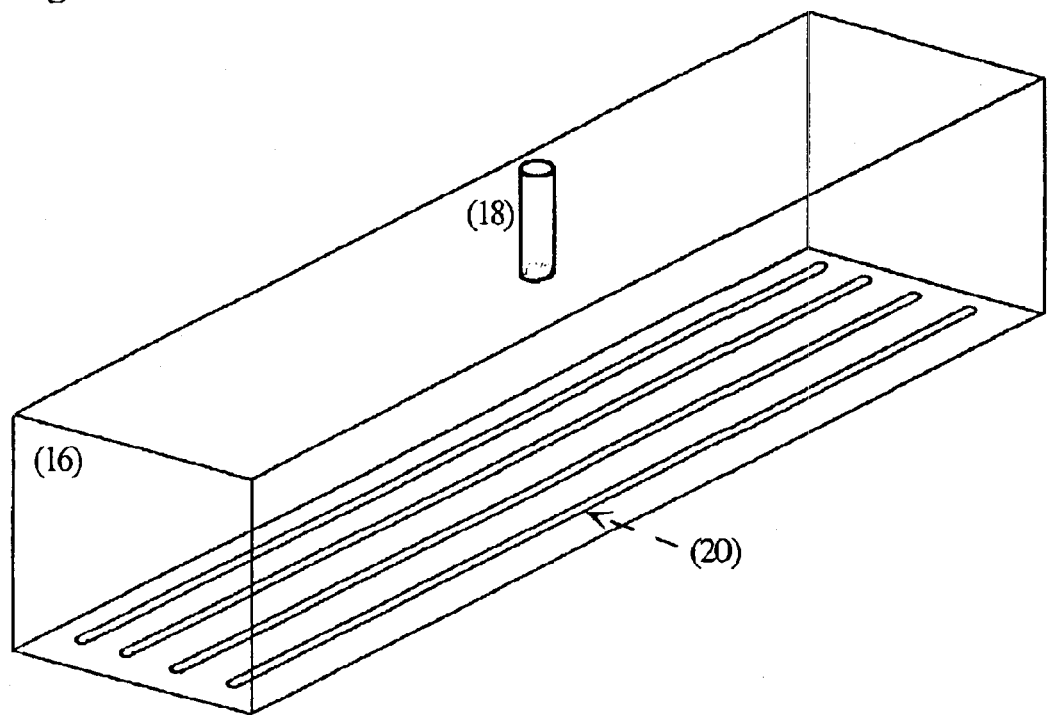
FIG. 3 is an illustration of the electrode with slits as outlet ports.

FIG. 3 is an illustration of a preferred embodiment of the electrode outlets (20), which are in the form of parallel or substantially parallel, substantially evenly spaced slits that extend approximately the length of the electrode. The width of the slits is preferably not less than 0.1 mm, more preferably not less than 0.2 mm, and most preferably not less than 0.5 mm; and preferably not more than 10 mm, more preferably not more than 5 mm, and most preferably not more than 2 mm.

Figure 4:
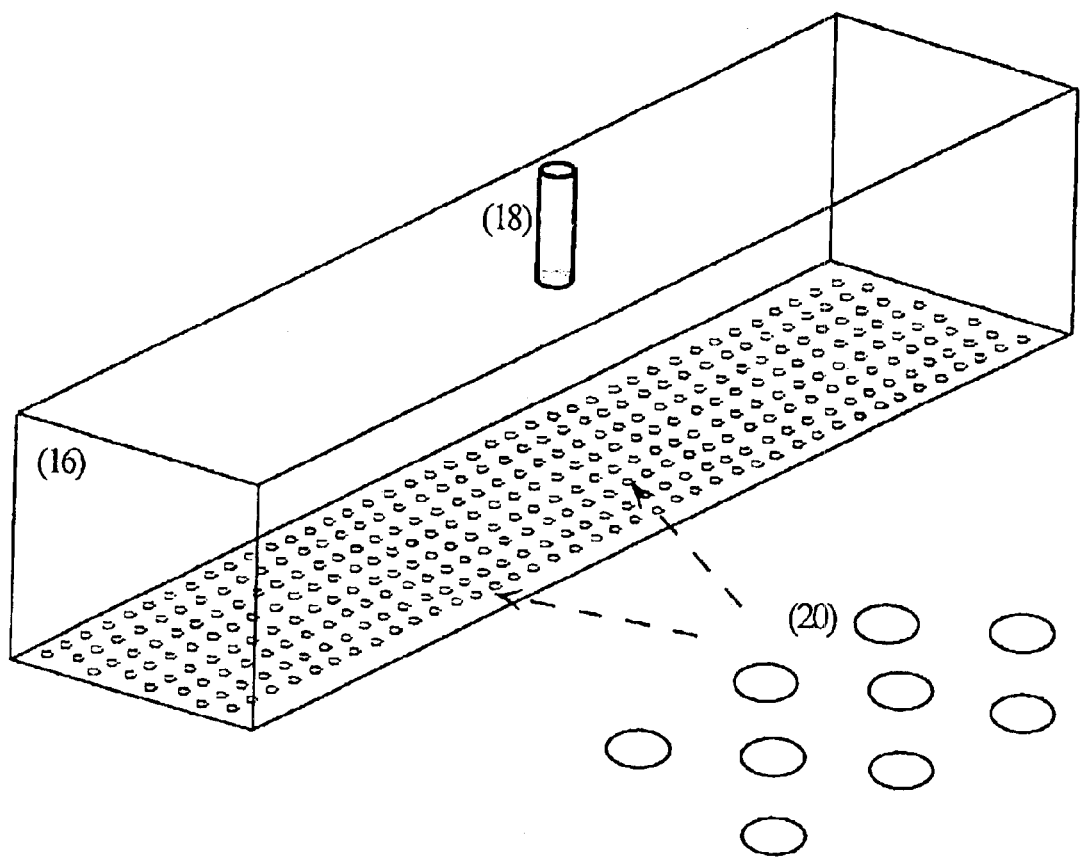
FIG. 4 is an illustration of an arrangement and geometry of the electrode outlet ports.

FIG. 4 is an illustration of another preferred geometry and spacing of the electrode outlets (20), which are in the form of substantially circular foramina. If this geometry is used to practice the method of the present invention, the diameter of the outlets is not less than 0.05 mm, more preferably not less than 0.1 mm, and most preferably not less than 0.2 mm; and preferably not greater than 10 mm, more preferably not greater than 5 mm, and most preferably not greater than 1 mm.

It has been surprisingly discovered that a monolithic, optically clear, contiguous coating that is powder-free or substantially powder-free can be deposited continuously on a substrate using the process of the present invention. Furthermore, the process parameters can be adjusted to form 1) a coating that renders the substrate chemically resistant (as defined by ASTM 543) to a wide variety of a) solvents, including acetone, benzene, carbon tetrachloride, diethyl ether, dimethyl formamide, ethyl acetate, ethylene dichloride, and toluene; b) acids, including as acetic acid, hydrochloric acid, hydrofluoric acid, nitric acid, and sulfuric acid; and c) bases, including ammonium hydroxide, sodium hydroxide, and phenol; 2) a coating with improved barrier to gases, including air, oxygen ($O_2$GTR, ASTM D 3985), water vapor (WVTR, ASTM F 1249), and carbon dioxide (GTR, ASTM D 1434); 3) a substrate with surface modification to create, for example, adhesion promotion and antifog properties; and 4) an optical coating with a desired refractive index.

The following examples are for illustrative purposes and are not intended to limit the invention in any way.

EXAMPLE 1

Method of Preparing an Optically Clear Coating on a Substrate

The coating is prepared using the set-up substantially as illustrated in FIG. 1. The counterelectrode, and power supply (fixed at 30 kHz) was obtained from Corotec Industries, Farmington, Conn. A 5.5" long×3" wide×2" high electrode (14 cm×7.5 cm×5 cm) is designed with a single inlet port and 4 exit ports in the shape of slits as illustrated in FIG. 3. The slits are each 1-mm wide and extend throughout the length of the electrode; there is a 1.5-cm separation between each slit. The same equipment is used in each example.

The substrate is a Lexan polycarbonate film (obtained from General Electric) with a thickness of 7 mil (0.18 mm). Tetramethyldisiloxane (TMDSO) was carried in nitrogen at a concentration of 16 percent v/v and mixed with the balance gas, which is air. The adjusted flow rate of the TMDSO is 80 sccm and the flow rate of the balance gas is 40 scfm ($1.1 \times 10^6$ sccm) and the concentration of TMDSO based on the total gas mixture is calculated to be 70 ppm. The power density of the corona discharge is 12 W/cm$^2$.

After 40 seconds of deposition time, the resultant coating had a thickness of about 1 µm and a chemical composition of $SiO_xC_yH_z$. The optical clarity of the coated substrate is measured to be 99.7 percent as compared to 100 percent for the original substrate. The haze of the coated substrate is found to be 0.7 percent as compared to 0.6 percent for the original substrate. Both measurements were carried out in accordance with ASTM D 1003-97.

EXAMPLE 2

Method of Preparing a Substrate with Solvent Resistance

The substrate, the working gas, the carrier gas for the working gas, the balance gas, and the balance gas flow rate, are also the same. The adjusted flow rate of the TMDSO is 50 sccm (45 ppm). The power density is 15 W/cm$^2$. After 10 seconds of deposition time, the resultant coating has a composition of $SiO_xC_yH_z$ and a thickness of 150 nm. The uncoated and coated substrates are subjected to acetone immersion for 10 minutes in accordance with ASTM 543. The uncoated substrate is found to be milky white and cracked while the coated substrate is found to be virtually unaffected.

EXAMPLE 3

Method of Preparing a Substrate with Increased Surface Energy

The substrate is a 20 g/m$^2$ polypropylene nonwoven. The working gas, carrier for the working gas, balance gas, and balance gas flow rates are the same as in the above examples. The adjusted flow rate of the TMDSO is 35 sccm (30 ppm), the power density is 5 W/cm$^2$ and the deposition time is 7 seconds. The surface energy is found to be 35 dynes/cm for the untreated substrate and 52 dynes/cm for the treated substrate.

EXAMPLE 4

Preparation of a Gas Barrier Coating

Two layers are deposited on Lexan polycarbonate film using two different working gases. The carrier gas for the working gas, the balance gas, and the balance gas flow rates are the same as in the previous examples. The first layer is an adhesion layer having a composition of $SiO_xC_yH_z$ formed using TMDSO as the working gas maintained at a flow rate of 65 sccm (60 ppm). The power density is set at 10 W/cm$^2$ and the deposition time is 10 seconds. The second layer is a barrier layer having the composition of $SiO_x$ formed with tetraethylorthosilicate (TEOS) as the working gas maintained at a flow rate of 15 seem (13 ppm). The power density is set at 15 W/cm$^2$ and the deposition time is 25 seconds. The oxygen gas transmission rate ($O_2$GTR) of the coated and uncoated substrate are measured in accordance with ASTM D 3985. $O_2$GTR is 32 mL/100 in$^2$*day*atm $O_2$ for the uncoated substrate and 0.05 mL/100 in$^2$*day*atm $O_2$ for the coated substrate.

What is claimed is:

1. A process for preparing an optically clear deposit onto a substrate comprising the steps of 1) creating a corona discharge in a region between a) an electrode having at least one inlet and at least one outlet and b) a counterelectrode supporting a substrate; and 2) flowing a mixture of a balance gas and a working gas and, optionally, a carrier gas for the working gas through the electrode and the corona discharge at a sufficient flow rate and at such proportions to form the optically clear deposit onto the substrate.

2. The process of claim 1 wherein the process is continuous and the counterelectrode supports a moving substrate.

3. The process of claim 2 wherein the counterelectrode is a rotating drum, and wherein either the drum or the electrode or both the drum and electrode are fitted with a dielectric sleeve.

4. The process of claim 1 wherein the working gas is an organosiloxane.

5. The process of claim 1 wherein the balance gas is air, oxygen, nitrogen, helium, argon, or a combination thereof.

6. The process of claim 1 wherein the at least one outlet of the electrode is a plurality of holes or slits, and the flow rate of the balance gas is such that the velocity of the balance gas passing through the holes or slits is not less than 0.1 m/s and not greater than 1000 m/s.

7. The process of claim 6 wherein the concentration of the working gas entering the corona discharge, based on the total gas mixture, is not less than 1 ppm and not greater than 2000 ppm.

8. The process of claim 7 wherein the substrate has an increased surface energy after plasma polymerized deposition as compared to an untreated substrate.

9. The process of claim 7 wherein the pressure of the corona discharge region is maintained at about atmospheric pressure and the concentration of the working gas based on the total gas mixture is not less than 5 ppm and not greater than 500 ppm.

10. The process of claim 9 wherein the deposit is a coating having an optical clarity of at least 98 percent and a haze value of not greater than 2 percent.

11. The process of claim 9 wherein the deposit forms a coating with an increased barrier to gases as compared to an untreated substrate.

12. The process of claim 9 wherein the deposit forms a coating that renders the substrate chemically resistant.

13. The process of claim 6 wherein the working gas is tetramethyldisiloxane, hexamethyldisiloxane, octamethyltrisiloxane, tetraethylorthosilicate, or combinations thereof.

14. A process for preparing a deposit onto a substrate comprising the steps of 1) creating a corona discharge in a region between a) an electrode having at least one inlet and at least one outlet and b) a counterelectrode supporting a substrate; and 2) flowing a mixture of a balance gas and a working gas and, optionally, a carrier gas for the working gas through the electrode and the corona discharge so as to form a plasma polymerized deposit on the substrate, wherein the total gas mixture has a flow rate such that the velocity through the at least one outlet is not less than 0.1 m/s and not greater than 1000 m/s and wherein the concentration of working gas based on the total gas mixture is not less than 5 ppm and not greater than 500 ppm.

15. The process of claim 14 which is a continuous process wherein the at least one outlet is a plurality of holes or slits, and the flow rate of the balance gas is such that the velocity of the total gas mixture passing through the holes or slits is not less than 10 m/s and not greater than 200 m/s, and wherein the substrate is a moving substrate.

16. The process of claim 14 wherein the deposit is an optically clear coating.

17. The process of claim 16 wherein the working gas is tetramethyldisiloxane, hexamethyldisiloxane, octamethyltrisiloxane, tetraethylorthosilicate, or combinations thereof, and the balance gas is air, oxygen, nitrogen, helium, argon, or combinations thereof.

18. The process of claim 14 wherein the electrode and counterelectrode are separated by at least 1 mm and not more than 10 mm, the corona discharge is generated a) at a frequency of at least 10 kHz and not greater than 60 kHz, and b) at a power density of at least 5 $W/cm^2$ and not greater than 50 $W/cm^2$.

19. A continuous process for preparing an optically clear coating onto a moving substrate comprising the steps of 1) creating a corona discharge in a region between a) an electrode having at least one inlet and at least one outlet and b) a counterelectrode supporting a moving substrate; and 2) flowing a mixture of a balance gas, a working gas and, optionally, a carrier gas for the working gas through the electrode and the corona discharge so as to form a plasma polymerizing coating on the substrate, wherein the balance gas has a flow rate such that the velocity through the at least one outlet is not less than 10 m/s and not greater than 200 m/s, wherein the concentration of the working gas based on the total gas mixture is not less than 5 ppm and not greater than 200 ppm, wherein the optically clear coating has an optical clarity of at least 98 percent and a haze value of not greater than 2 percent.

* * * * *